United States Patent [19]
Hwang

[11] Patent Number: 5,573,974
[45] Date of Patent: Nov. 12, 1996

[54] METHOD FOR ISOLATING SEMICONDUCTOR ELEMENTS

[75] Inventor: Hyunsang Hwang, Seoul, Rep. of Korea

[73] Assignee: LG Semicon Co., Ltd., Chungcheongbuk-do, Rep. of Korea

[21] Appl. No.: 442,058

[22] Filed: May 16, 1995

[30] Foreign Application Priority Data

Jan. 11, 1995 [KR] Rep. of Korea ............ 95-393

[51] Int. Cl.$^6$ ................................. H01L 21/76
[52] U.S. Cl. .................... 437/69; 437/70; 437/242
[58] Field of Search ...................... 437/69, 70, 72, 437/73, 242

[56] References Cited

U.S. PATENT DOCUMENTS

| | | | |
|---|---|---|---|
| 4,135,954 | 1/1979 | Chang et al. | 156/643 |
| 4,553,314 | 11/1985 | Chan et al. | 437/70 |
| 4,631,219 | 12/1986 | Geipel, Jr. et al. | 428/131 |
| 4,980,307 | 12/1990 | Ito et al. | 437/40 |
| 5,019,526 | 5/1991 | Yamane et al. | 437/699 |

FOREIGN PATENT DOCUMENTS

| | | | |
|---|---|---|---|
| 0094643 | 7/1981 | Japan | 437/70 |
| 0057228 | 3/1987 | Japan . | |
| 0110934 | 4/1990 | Japan | 437/69 |
| 0266435 | 11/1991 | Japan . | |
| 0100243 | 4/1992 | Japan . | |

*Primary Examiner*—Trung Dang
*Attorney, Agent, or Firm*—Finnegan, Henderson, Farabow, Garrett & Dunner, L.L.P.

[57] ABSTRACT

A method for isolating semiconductor elements, A oxynitride has an intermediate property between an oxide and a nitride, and therefore, it has an excellent selection ratio when etching the oxide and the nitride (particularly during a wet etching. The method for isolating semiconductor elements includes the steps of: (1) forming a pad oxide layer on a silicon substrate, and depositing silicon nitride; (2) carrying out a photo etching process to remove the silicon nitride layer of a field region as a region other than an active region; (3) carrying out a field oxidation process to form a field oxide layer on the field region; (4) carrying out a heat treatment under an $NH_3$ atmosphere to form an oxynitride layer on the field oxide layer; and (5) removing the nitride layer, growing a sacrificial oxide layer, and removing the sacrificial oxide layer by applying a wet etching method.

5 Claims, 2 Drawing Sheets

METHOD FOR ISOLATING SEMICONDUCTOR ELEMENTS

FIELD OF THE INVENTION

The present invention relates to a method for isolating semiconductor elements, in which the LOCOS process as one of the semiconductor elements isolating method is improved, and this, the problem that a field oxide layer is rendered thin during an etching of the field oxide layer is solved. That is, in the conventional method, the field oxide layer is grown by much more than necessary, and a considerable part of it is removed in a later process, thereby causing many problems. The present invention solves these problems.

BACKGROUND OF THE INVENTION

As shown in the partial sectional view of FIG. 1A, the conventional typical LOCOS process is carried out in the following manner. That is, a pad oxide layer 12 is formed on a semiconductor substrate 11, and then, a silicon nitride layer 13 is deposited thereupon. Then an isolating region (field region) is patterned by applying a photo etching method. Thereafter, a field oxidation process is applied to grow a thick field oxide layer.

Then, as shown in FIG. 1B, the nitride layer 13 is removed, and then, the pad oxide layer 12 is removed. Then a sacrificial oxide layer is grown, and this is etched, thereby forming a structure of FIG. 1C.

Through such a process, an element forming region and an element isolating region, i.e., an active region and a field region are separated from each other on a semiconductor substrate, and then, a gate oxide layer, a gate electrode and a source/drain region are formed, thereby completing a transistor.

In this conventional method, after the field oxide layer is formed, the oxide layer is etched two times, and therefore, a considerable portion of the filed oxide layer is removed, this becoming a problem. In actual, prior to growing the gate oxide layer, the sacrificial oxide layer has to be completely removed, and therefore, an excessive etching is done, with the result that the etched amount of the field oxide layer is increased far too much. Consequently, the corners of the isolating region is recessed and exposed, with the result that the electrical characteristics are aggravated (junction leakage, oxide breakdown and the like).

Further, in the conventional typical LOCOS process, a thick field oxide layer is grown by much more than necessary, and therefore, stress occurs to generate defects.

Further, after the growing of the field oxide layer, the etching is carried out by two times (etching of the pad oxide layer and the sacrificial oxide layer), and therefore, a considerable amount of the field oxide is removed. Therefore, the field oxide layer has to be formed thick at the initial stage. Further, due to the excessive etching, the silicon portions of the corners of the isolating region is dug into the active region, and therefore, the electrical characteristics are aggravated. Further, the field oxide layer which is disposed vertically relative to the gate may be considerably removed during an etching for forming an oxide side wall for an LDD.

SUMMARY OF THE INVENTION

The present invention is intended to overcome the above described disadvantages of the conventional techniques.

Therefore it is the object of the present invention to provide a method for isolating semiconductor elements, in which the LOCOS process as one of the semiconductor elements isolating method is improved, and thus, the problem that a field oxide layer is rendered thin during an etching of the field oxide layer is solved.

First, a field oxidation process is carried out, and then, a heat treatment is carried out under an $NH_3$ atmosphere to form a thin oxynitride layer (SiOxNy) on the surface of the field oxide layer. Then the nitride layer is wet-etched by using a phosphoric acid solution. Under this condition, the nitride/oxynitride has a high selection ratio, and therefore, it is almost not etched. Then, the pad oxide layer is etched, and a sacrificial oxide layer is grown and etched. When the pad oxide layer and the sacrificial oxide layer are etched, the oxide/oxynitride is not etched owing to a high selection ratio.

Thus, the etching of the oxide of the field oxide region can be perfectly prevented during the process, and therefore, the excessive growing of the field oxide layer as seen in the conventional technique can be avoided.

The principal idea of the present invention lies in the fact that the oxynitride has an intermediate property between an oxide and a nitride, and therefore, it has an excellent selection ratio when etching the oxide and the nitride (particularly during a wet etching).

In achieving the above object, the method for isolating semiconductor elements according to the present invention includes the steps of: (1) forming a pad oxide layer on a silicon substrate, and depositing silicon nitride; (2) carrying out a photo etching process to remove the silicon nitride layer of a field region as a region other than an active region; (3) carrying out a field oxidation process to form a field oxide layer on the field region; (4) carrying out a heat treatment under an $NH_3$ atmosphere to form an oxynitride layer on the field oxide layer; and (5) removing the nitride layer, growing a sacrificial oxide layer, and removing the sacrificial oxide layer by applying a wet etching method.

More specifically, at step (1), the pad oxide layer is oxidized to be grown to about 100–200 Å, and the silicon nitride layer is formed to a thickness of about 2000 Å by applying a chemical vapor deposition method. At step (2), the silicon nitride layer is anisotropically etched by applying a dry etching method. At the field oxidizing of step (3), a wet oxidation is carried out at 950° C. for 2 hours to grow a field oxide layer by 4000 Å or more. At step (4), a heat treatment is carried out under an $NH_3$ atmosphere at 900° C. to 1000° C. for 5 minutes to 60 minutes. At step (5), the nitride layer is wet-etched by using a phosphoric acid solution, and the sacrificial oxide layer is grown to about 100–200 Å, and is etched by using an HF solution.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

FIGS. 2(A)–2(D) are partial sectional views showing the method for isolating semiconductor elements according to the present invention.

The method for isolating semiconductor elements according to the present invention is carried out in the following manner.

Figure 1:
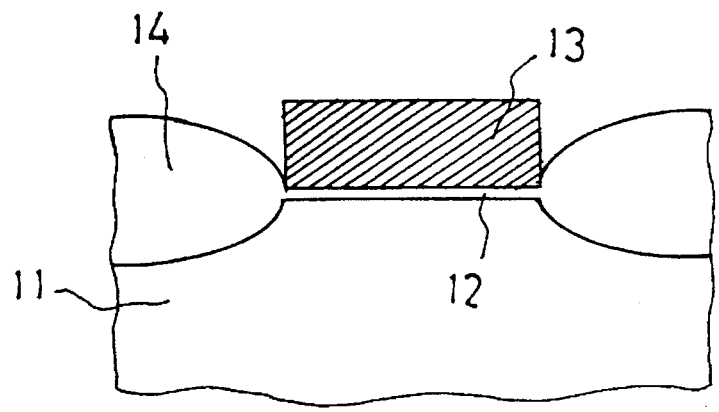
FIGS. 1(A)–1(C) are partial sectional views showing the conventional method for isolating semiconductor elements.
Figure 1:
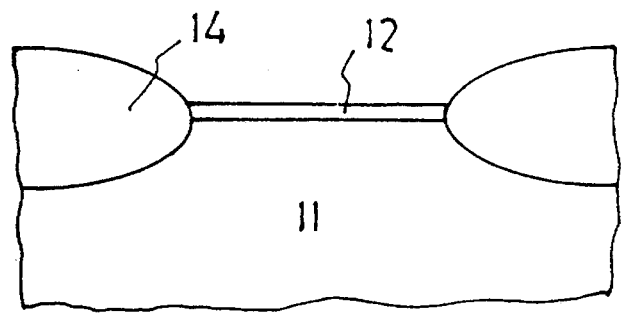
Figure 1:
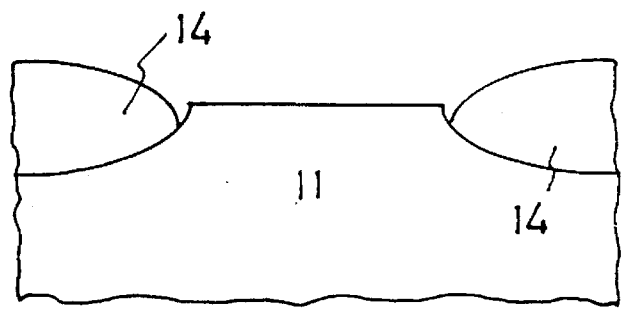
Figure 2:
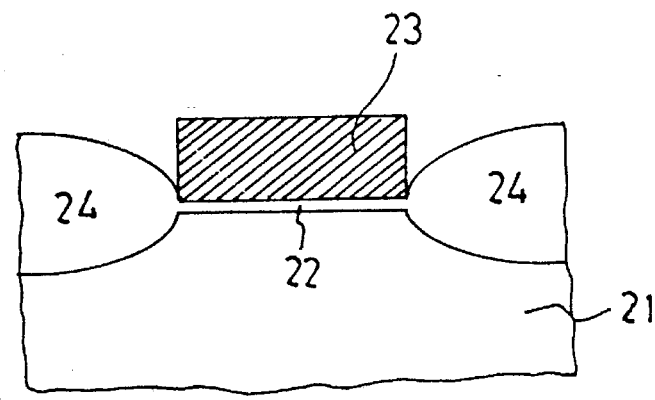
FIGS. 2(A)–2(D) are partial sectional views showing the method for isolating semiconductor elements according to the present invention.
Figure 2:
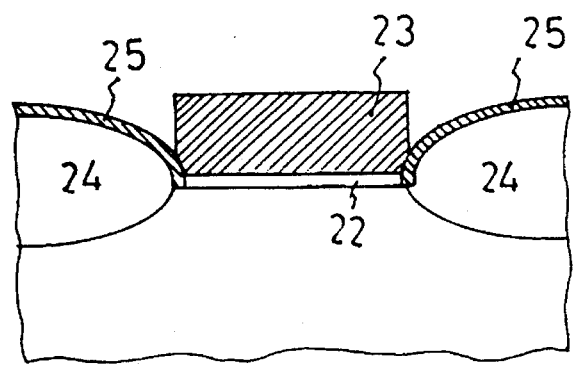
Figure 2:
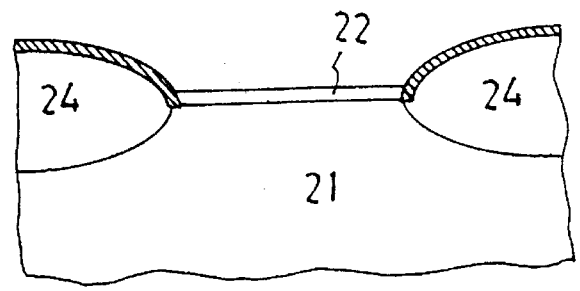
Figure 2:
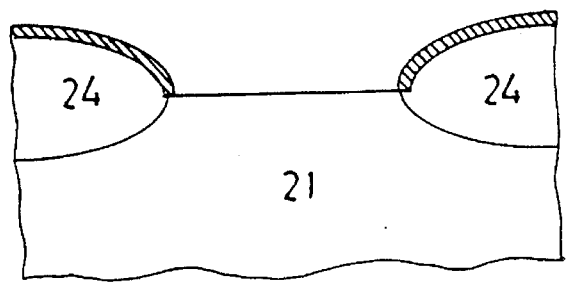

First as shown in FIG. 2A, a pad oxide layer 22 is grown to 100–200 Å upon a silicon substrate 21, and then, a nitride layer 23 is deposited on the whole surface by about 2000 Å. Then, an active region is defined by applying a photolithography process, and then, a portion of the nitride layer, which is disposed on a region other than the active region, i.e., on the field region, is removed by dry-etching.

Then a field oxidation process is carried out. This process is carried out at about 950° C. for 2 hours in the form of a wet etching, thereby forming a thick field oxide layer 24 by 4000 Å or more. Up to this point, the usual process is applied.

Then as shown in FIG. 2B, a heat treatment is carried out under an $NH_3$ atmosphere to form an oxynitride layer 25 on the surface of the field oxide layer. This process is carried out at 900° C. to 1000° C. for 5 minutes to 60 minutes, thereby forming the oxynitride layer on the surface of the field oxide layer.

Then as shown in FIG. 2C, the nitride layer 23 is removed by applying a wet etching method. Under this condition, the oxynitride is almost not removed owing to its high selection ratio. The etching fluid used here is a phosphoric acid solution.

Then as shown in FIG. 2D, the pad oxide layer 22 is removed by carrying out a wet etching method, and the etching fluid used here is an HF solution.

Then a sacrificial oxide layer is grown to 100–200 Å, and this is removed by carrying out a dry etching. Under this condition, the oxynitride layer which is disposed upon the field oxide layer is almost not removed owing to its high selection ratio.

According to the method for isolating semiconductor elements as described above, an etching of the field oxide layer can be prevented during the etching of the pad oxide layer and the sacrificial oxide layer, thereby making it possible to improve the isolating characteristics. Further, the thickness of the field oxide layer which is grown by applying a field oxidation process may well be thin, and therefore, the defect occurrence due to the stress is relatively reduced. Further, the peeling of a portion of the substrate, which corresponds to the corners of the isolating region, can be avoided during the etching of the field oxide layer. Further, the field oxide layer which is disposed vertically relative to the gate can be prevented from being excessively etched during the etching of a side wall spacer, thereby preventing the aggravation of the isolating characteristics.

The present invention can be applied to other cases in which an isolation is made by means of an oxide, so as to prevent an over-etching. The present invention can be applied also to the recently disclosed advanced LOCOS processes such as SILO, SWAMI, OSELO, SPOT, FUROX and the like.

What is claimed is:

1. A method for isolating semiconductor elements, comprising the steps of:

(1) forming a pad oxide layer on a surface of a silicon substrate, and depositing g silicon nitride layer;

(2) carrying out a photo etching process to remove the silicon nitride layer of a field region as a region other than an active region;

(3) carrying out a field oxidation process to form a field oxide layer on said field region;

(4) carrying out a heat treatment under an $NH_3$ atmosphere to form an oxynitride layer on said field oxide layer; and (5) removing said nitride layer, growing a sacrificial oxide layer, and removing said sacrificial oxide layer by applying an etching method to expose a portion of said surface of said substrate, said oxynitride layer extends to said portion of said surface of said substrate.

2. The method as claimed in claim 1, wherein:

at step (1), said pad oxide layer is oxidized to be grown, and said silicon nitride layer is formed by applying a chemical vapor deposition method;

at step (2), said silicon nitride layer is etched by applying a dry etching method; and at step (5), said nitride layer and said sacrificial oxide layer are wet-etched.

3. The method as claimed in claim 2, wherein:

said pad oxide layer is oxidized to be grown to about 100–200 Å, and said silicon nitride layer is formed to a thickness of about 2000 Å;

a wet oxidation is carried out at 950° C. for 2 hours to grow said field oxide layer by 4000 Å or more; and said sacrificial oxide layer is grown to about 100–200 Å.

4. The method as claimed in claim 1, wherein, at step (4), said heat treatment is carried out under an $NH_3$ atmosphere at 900° C. to 1000° C. for 5 minutes to 60 minutes.

5. The method as claimed in claim 1, wherein:

at step (1), said pad oxide layer is oxidized to be grown to about 100–200 Å;

at step (1), said silicon nitride layer is formed to a thickness of about 2000 Å by applying a chemical vapor deposition method;

at step (2), the silicon nitride layer is anisotropically etched by applying a dry etching method;

at the field oxidizing of step (3), a wet oxidation is carried out at 950° C. for 2 hours to grow said field oxide layer by 4000 Å or more;

at step (4), said heat treatment is carried out under an $NH_3$ atmosphere at 900° C. to 1000° C. for 5 minutes to 60 minutes; and at step (5), said nitride layer is wet-etched by using a phosphoric acid solution, and said sacrificial oxide layer is grown to about 100–200 Å, and is etched by using an HF solution.

\* \* \* \* \*